United States Patent
Pullen et al.

[11] Patent Number: 6,107,875
[45] Date of Patent: Aug. 22, 2000

[54] VARIABLE FREQUENCY CLASS D MODULATOR WITH BUILT IN SOFT CLIPPING AND FREQUENCY LIMITING

[75] Inventors: Stuart W. Pullen, Raleigh, N.C.; Patrick A. Begley, West Melbourne, Fla.; Donald R. Preslar, Somerville, N.J.

[73] Assignee: Intersil Corporation, Palm Bay, Fla.

[21] Appl. No.: 09/173,111

[22] Filed: Oct. 15, 1998

[51] Int. Cl.[7] .................................................. H03F 3/38
[52] U.S. Cl. ............................................. 330/10; 330/251
[58] Field of Search ....................... 330/251, 10, 207 A; 332/109

[56] References Cited

U.S. PATENT DOCUMENTS

| | | |
|---|---|---|
| 4,571,551 | 2/1986 | Trager . |
| 4,600,891 | 7/1986 | Taylor et al. . |
| 5,160,896 | 11/1992 | McCorkle . |
| 5,410,592 | 4/1995 | Wagner et al. .......................... 379/388 |
| 5,523,715 | 6/1996 | Schrader ................................... 330/10 |
| 5,767,740 | 6/1998 | Fogg ......................................... 330/10 |
| 5,805,020 | 9/1998 | Danz et al. ............................... 330/10 |
| 5,838,193 | 11/1998 | Myers et al. ............................. 330/10 |

*Primary Examiner*—Benny Lee
*Assistant Examiner*—Henry Choe
*Attorney, Agent, or Firm*—Jaeckle Fleischmann & Mugel, LLP

[57] ABSTRACT

A class D amplifier 100 has an integrator 10, a comparator 12, and a frequency compensation and gain control (FCGC) circuit 40. The FCGC circuit 40 senses the output and reduces the gain in order to keep the sampling frequency high enough to avoid audio artifacts.

12 Claims, 4 Drawing Sheets

VARIABLE FREQUENCY CLASS D MODULATOR WITH BUILT IN SOFT CLIPPING AND FREQUENCY LIMITING

This invention relates in general to class D amplifiers and in particular to a variable frequency class D modulator that uses gain compression to ensure that the switching frequency never falls below a minimum target.

BACKGROUND OF THE INVENTION

Advances in MOSFET technology as well as advances in integrated circuits have made it possible to apply class D amplifiers to audio applications. Class D amplifiers are significantly more efficient than class AB amplifiers. The disadvantages are higher part count, cost, electromagnetic interference, and poor performance. With increased integration and the introduction of sophisticated control integrated circuits these disadvantages are becoming less pronounced. In the near future, class D amplifiers will replace class AB amplifiers in many applications. Class D amplifiers already have a clear advantage in high power applications. As the cost and component count of these amplifiers fall, class D amplifiers will be able to complete with class AB amplifiers in low and medium power applications.

To overcome the poor performance of class D amplifiers, others have suggested a self oscillating variable frequency modulator as shown in FIG. 1. An integrator 10 has an audio input over an input resistor $R_{IN}$. It has a digital feedback input A over resistor $R_{DFB}$, and an analog feedback at input B over resistor $R_{AFB}$. The respective analog and digital feedback signals A, B, are taken from the output of the bridge circuit 20 and the low-pass filter that comprises the inductor L and capacitor $C_{LP}$. For purposes of understanding, let us simply focus on the digital output A and assume that there is no audio input. In this case, the output at point A is a square wave with a 50% duty cycle. When the square wave is high, current flows through $R_{DFB}$ into the summing junction of the integrator 10. Its output ramps down until it reaches the negative threshold of the comparator 12. R1 and R2 are used to add hysteresis to the comparator 12. These resistors can be used to adjust the comparator positive and negative thresholds. When the output of the comparator 12 goes low, the upper FET 22 turns off and after a short delay the lower FET 24 turns on. The square wave goes low, and current now flows out of the integrator 10 summing junction through $R_{DFB}$. The output of the integrator 10 reverses and ramps up until it reaches the positive threshold of the comparator 12. This signals the lower FET 24 to turn off and after a short delay the upper FET 22 turns on. The square wave goes high and the cycle continues. With no audio signal, the output at A is a 50% square wave, and the output of the integrator 10 is a triangle wave.

Now consider the case when an audio signal is applied. Assuming that the audio signal is positive, then current flows through $R_{IN}$ into the integrator summing junction. Current also flows through $R_{AFB}$ out of the summing junction (negative feedback). The net contribution of the audio signal to the integrator summing junction current is $I_{RIN}-I_{RAFB}$. When the upper FET 22 is on, the currents $I_{DFB}$ and $(I_{RIN}-I_{RAFB})$ are both into the summing junction. This speeds up the ramp at the output of the integrator 10. When the lower FET 24 is on, the current through $I_{DFB}$ reverses and the two current now are in opposite directions. This slows the ramp down. A similar analysis can be applied to the case where the input signal is negative.

Since the hysteresis built into the comparator 12 is constant, the slope of the positive and negative ramps directly effects the positive and negative pulse widths, and therefore the duty cycle and frequency of the comparator output. At the higher positive audio input voltages, the audio output becomes negative and the on time of the high side switch becomes negligible compared to the on time period of the low side switch. The width of the low side pulse is roughly proportional to the output voltage and primarily sets the loop frequency.

A disadvantage of the self-oscillating circuit in FIG. 1 is shown in FIG. 2. There is that shown a plot of the switching frequency of the modulator as a function of the output power. The switching frequency varies inversely with the output power. Thus, at high power output, the switching frequency falls. As the switching frequency falls into a range that approaches the frequency of the audio input, distortion artifacts appear. They are due to an inadequate sampling rate at the reduced frequency. As the switching frequency transverses the audio spectrum, the low pass filter can no longer attenuate the carrier. This energy can damage tweeters.

Thus, it is necessary to keep the switching frequency well above audio frequency. In the past, this has been accomplished by substantially over-designing the amplifier so that its maximum power output is as much as twice the desired power. In other words, to achieve a non-distorted output at 250 watts of power, the prior art class D amplifier is designed to have a maximum power output of as much as 500 watts. From a study of the graph in FIG. 2, it can be seen that as maximum power is increased, the switching frequency for any given output power tends to decrease. If the class D amplifier has a sufficiently high enough power output, there is little or no danger that the switching frequency will fall into the audio spectrum, i.e., at or about 20 kHz or less. Of course, the disadvantage of such an amplifier is that its component parts are substantially oversized in order to accommodate the high output power.

Another solution to the problem has been to limit the audio input. Others have used pre-amplifiers connected between the audio signal and the input to the integrator. The pre-amplifier attenuates the audio input signal in order to make sure that the overall output of the class D amplifier remains substantially less than its maximum power output. This solution has the drawback of reducing the maximum output power. Furthermore, this approach will not work if the bus voltage is low, because the carrier frequency will be much lower at a specified output power. Unless some provision is made to roll the gain off slowly, the input clamping circuit will produce high order harmonics and the music will sound harsh.

As a result of these deficiencies in prior art class D amplifiers, there is a need for an amplifier that is not only self-oscillating but also prevents the switching frequency from falling into the audio range without oversizing the devices and the overall power for the amplifier.

SUMMARY OF THE INVENTION

The invention solves the problem of the prior art and provides a class D amplifier that is self-oscillating and automatically compresses the gain in order to maintain a sampling frequency greater than the audio input frequency. Since the gain compression is gradual (soft clipping), the distortion produced is inaudible. The invention provides a closed loop class D amplifier which includes an integrator, a comparator, a driver circuit, a bridge circuit, a low-pass filter circuit, and a frequency compensation and gain compression circuit. The integrator has a plurality of inputs including an audio frequency input, an audio feedback input, and a digital feedback input. The integrator is coupled to a comparator. The comparator generates a series of sampling pulses and each sampling pulse has a width that is proportional to the slope of the integrator ramp. The frequency of the pulses of the comparator varies inversely with the output power of the amplifier. The comparator outputs a series of pulses which are input to a driver circuit. The driver circuit generates gate drive signals for a bridge circuit. Each MOSFET has its gate coupled to one of the gate drive signals for generating an output digital audio signal. The digital audio signal is converted into an analog audio signal by a low-pass filter. The filter is coupled between the bridge circuit and an audio output device such as a speaker. A frequency compensation and gain compression circuit (FCGC) is coupled between the output of the driver circuit and the input to the comparator. The FCGC circuit measures the duration of the pulses output by the comparator. If the comparator does not change state within a pre-determined time window, the FCGC circuit alters the current to the integrator to reduce the gain of the integrator and simultaneously maintain the sampling frequency above the audio input frequency.

DRAWINGS

Figure 6:
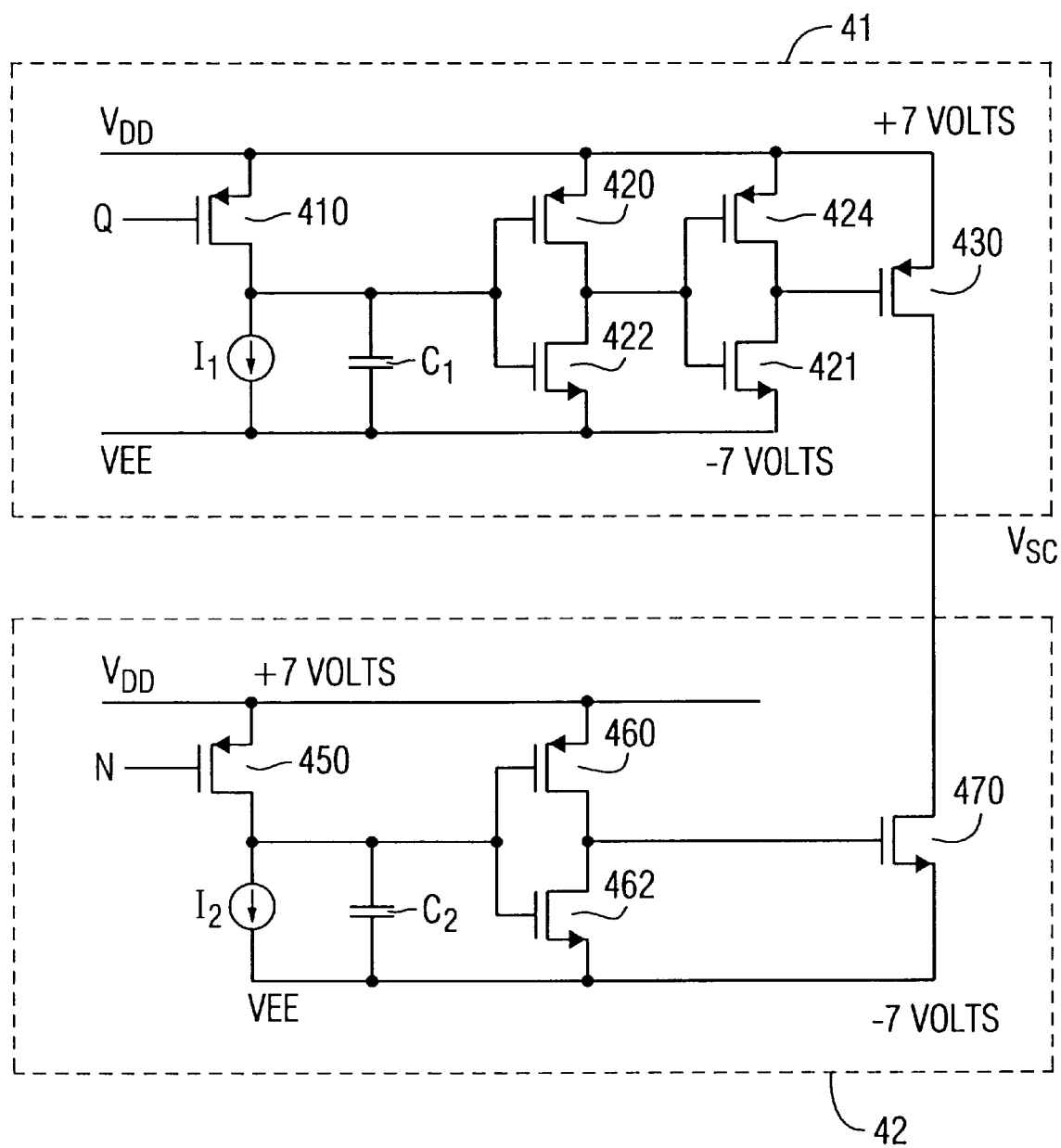

FIG. 5 (a), (b) are graphs comparing the output signal of a prior art amplifier with the output signal of the invented amplifier;

FIG. 6 is a detailed schematic of one embodiment of the frequency compensation and gain compression circuit.

DETAILED DESCRIPTION

Figure 1:
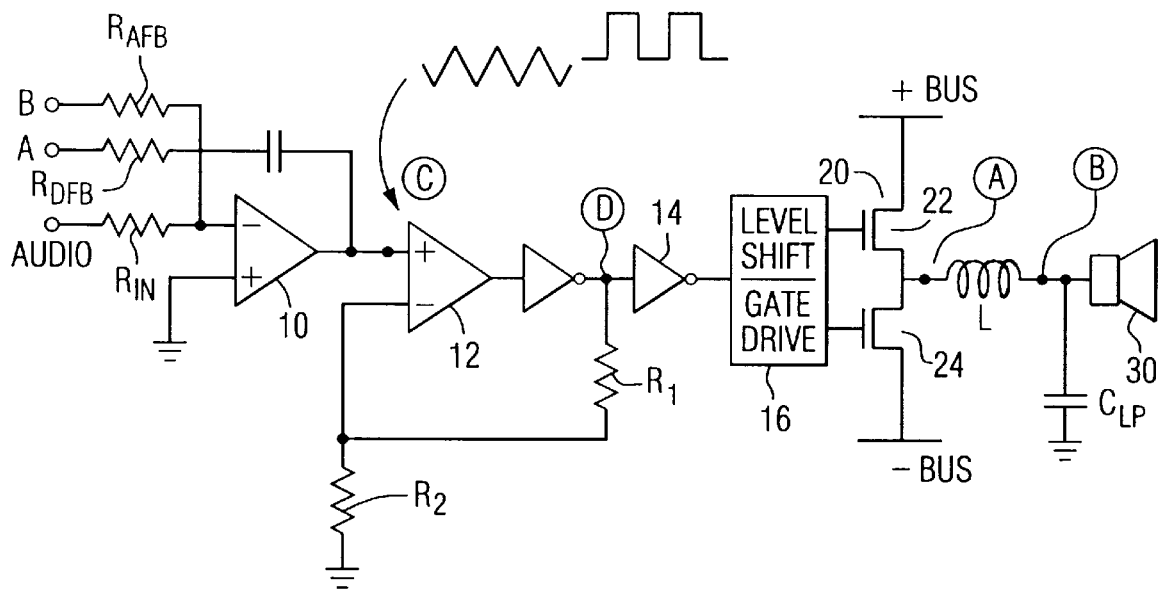
FIG. 1 is a prior art closed loop class D amplifier.
Figure 2:
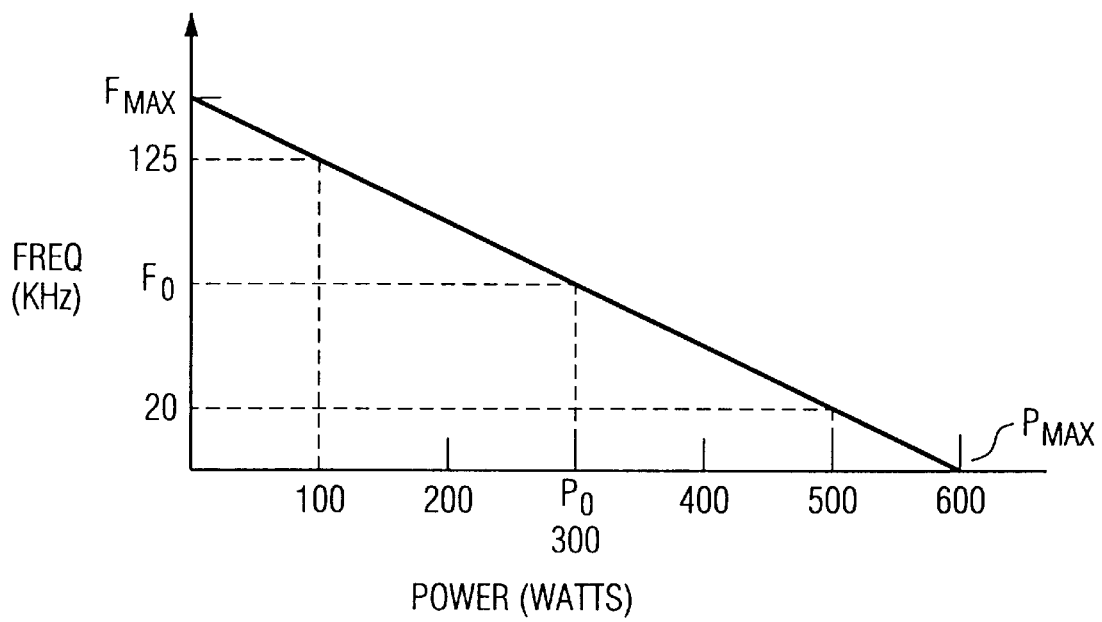
FIG. 2 is a graph representing the sampling frequencing as a function of power for the class D amplifier of FIG. 1.
Figure 3:
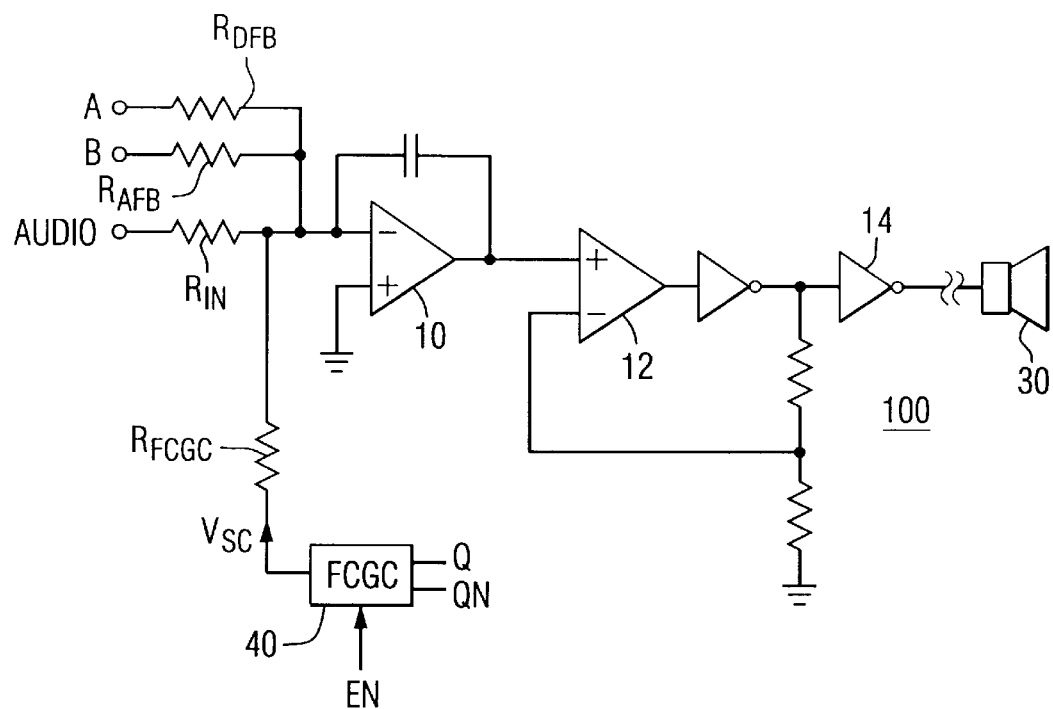
FIG. 3 is an electrical schematic of a class D amplifier of the invention.
Figure 4:
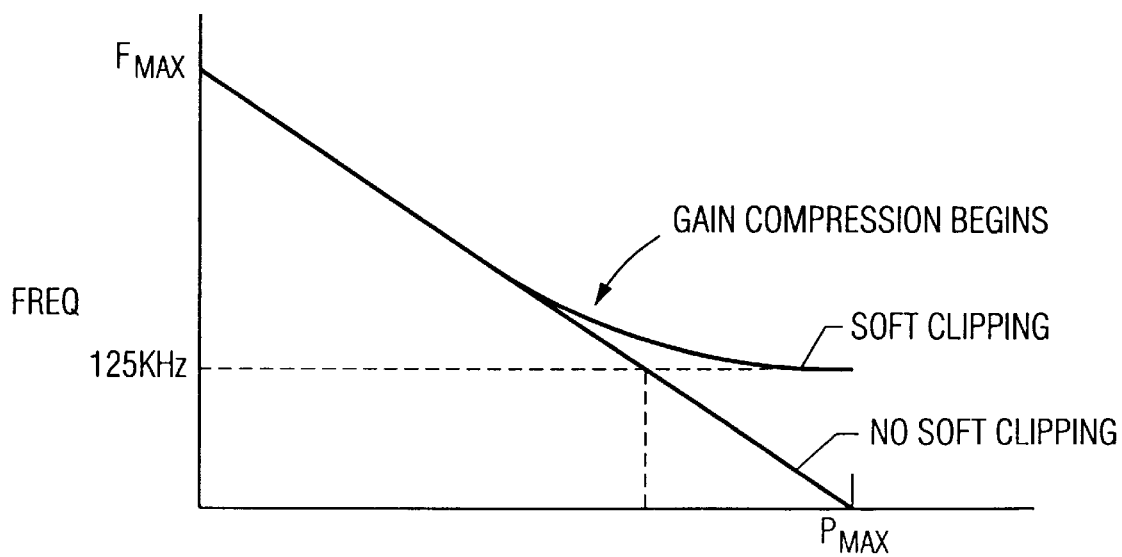
FIG. 4 is a graph showing the sampling frequency verses the output power of the invention.
Figure 5A:
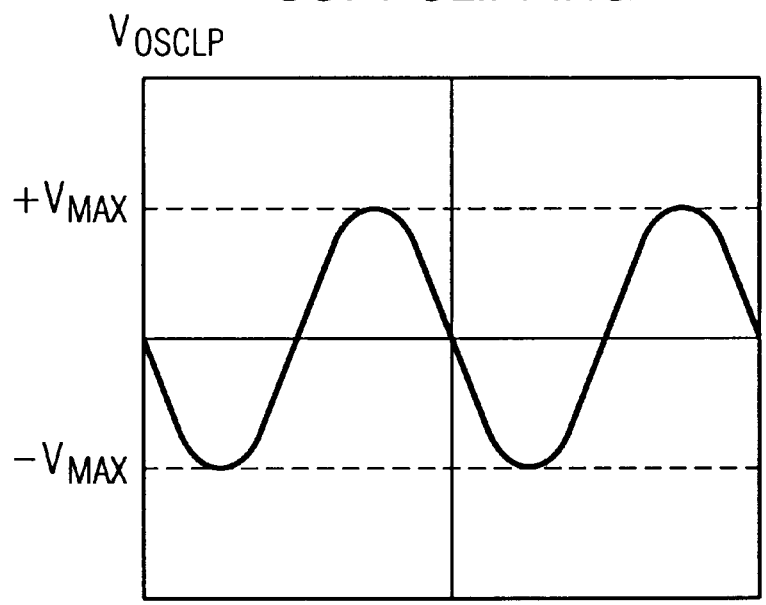
Figure 5B:
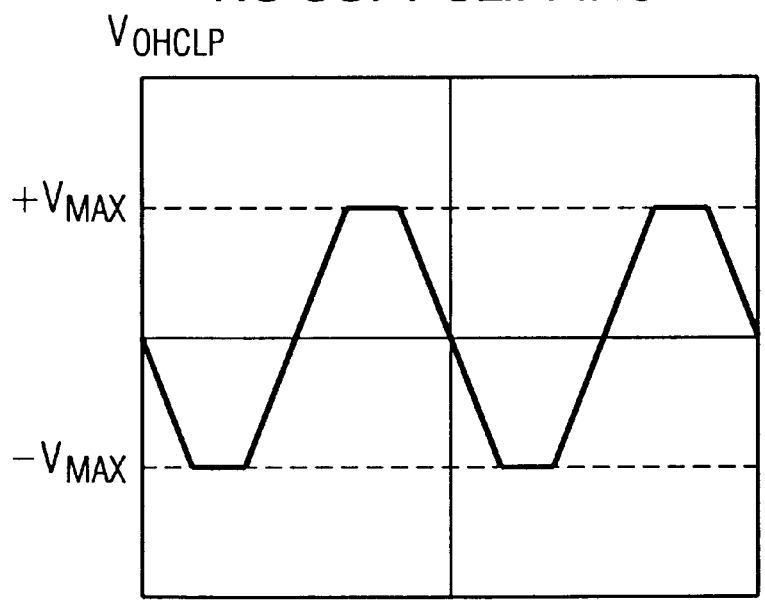

With reference to FIG. 3, the class D amplifier 100 includes components whose like reference numerals are the same as components in FIG. 1. As such, the amplifier 100 has an integrator 10, a comparator 12 and an output speaker 30. The level shift gate driver and half-bridge are omitted from the figure. However, those skilled in the art will understand that such components are included in the audio amplifier 100. The feedback signals from the digital output and the audio output are likewise input to the integrator 10. The FCGC circuit 40 has inputs Q and QN which is the inverse of signal Q. Signal Q represents the state of the output of the comparator 12. Thus, Q is either high or low. The output of FCGC circuit 40 is coupled to a resistor $R_{FCGC}$ and from there to the integrator 10. The FCGC circuit 40 includes a current source, a capacitor, and an inverter for measuring the duration of each of the signals Q and QN. If the duration of either signal Q or QN exceeds a predetermined time window, typically 7.5 microseconds, the FCGC circuit will either inject or sink a current from the amplifier 10. When the signal Q or QN exceeds the time window, that indicates that the integrator 10 is saturated and that the output power is stuck at maximum. Unless the situation is quickly remedied, the listener will detect audio artifacts which correspond to a hard clipping in the audio output. A typical hard clipped audio output is shown in FIG. 5(b) where the output of the prior art amplifier, $V_{OHCLP}$, is truncated at an output $\pm V_{MAX}$ that corresponds to the maximum output of the amplifier. If the state of the comparator remains fixed for more than 7.5 microseconds, it is likely that the integrator 10 will saturate an produce a hard output clip such as that shown in the upper graph of FIG. 5(b). In order to prevent a hard clip, the FCGC circuit 40 injects or sinks current into the integrator 10 in order to rapidly change the state of the comparator 12. As such, if the output of the comparator 12 is Q, current is added to the integrator 10 in order to switch the comparator 12 to QN. Likewise, if the output of the comparator 12 is QN or low, current is removed from the integrator 10 in order to rapidly switch the comparator 12 to its high, Q output.

The FCGC circuit 40 effectively alters the gain of the amplifier 100 by either adding or subtracting current to the integrator. This phenomenon is known as gain compression and results in a modified output signal known as a soft-clipped signal. A typical soft-clipped signal is shown in FIG. 5(a) with the vertical axis identified as $V_{OSCLP}$. As the signal rises towards the maximum value $V_{MAX}$, the output $V_{OSCLP}$ gradually tapers. This gradual taper is distinctly different from the hard-clipped input wave form shown in FIG. 5(b). Since the gain is reduced, the integrator 10 never saturates. As a further result, the sampling frequency of the amplifier 100 is automatically compensated to remain above the audio frequency. For example, in a preferred embodiment of the invention, the amplifier 100 maintains a sampling frequency at no less than 125 kHz for an approximate maximum output of 125 watts into 8 ohms. As a result, above a chosen threshold that corresponds to the time window sampled by FCGC circuit 40, the amplifier 100 continuously and gradually reduces the gain in order to prevent a hard clip of the output signal and maintains the sampling frequency of the comparator at a frequency substantially greater than the frequency of the input audio signal.

The FCGC circuit 40 is shown in greater detail in FIG. 6. The following description for subcircuit 41 explains how the circuit operates after the comparator 12 has held signal Q high for more than 7.5 microseconds. Those skilled in the art will appreciate that subcircuit 42 is substantially identical to subcircuit 41 and compensates for the opposite state signal, QN.

Current source $I_1$ continuously seeks to discharge capacitor $C_1$. PMOS transistor 410 is coupled to the high rail $V_{DD}$ at typically +7 volts. The other end of transistor 410 is coupled to capacitor $C_1$. When Q goes low, PMOS transistor 410 turns on and charges capacitor $C_1$. The charging time of the capacitor is on the order of 100 ns. When Q is high, the current source $I_1$ begins discharging the capacitor $C_1$. $I_1$, $C_1$ and the threshold of the inverter, 422 and 420 are chosen in the preferred embodiment so that the inverter output goes high if Q is high for 7.5 microseconds. The next inverter, 424 and 426, turns on PMOS 430. The +7 volts is applied to the resistor $R_{FCGC}$ and current is injected into the integrator 10. Since this current opposes the audio input current, the net effect is to reduce the gain of the amplifier. As the amplifier is driven harder, the pulses on Vsc become wider. Thus, gain compression gradually increases. The result is soft clipping as shown in FIG. 5.

Subcircuit 42 performs a similar function when QN is high for more than 7.5 microseconds. Current source $I_2$ seeks to discharge capacitor $C_2$. Transistor 450 is coupled between the high rail $V_{DD}$ and the capacitor $C_2$. $C_2$, $I_2$, and the threshold of the inverter, 462 and 460, are sized so that NMOS 450 will turn on if the input QN is high for approximately 7.5 microseconds to turn on NMOS. Now current flows out of the integrator summing junction through $R_{FCGC}$. Like before, this current opposes the audio input current so the net effect is to reduce the gain of the amplifier.

Having thus described the invention including a preferred embodiment thereof, those skilled in the art will appreciate that further modifications, changes, omissions and deletions may be made to the invention without departing from its spirit and scope as set forth in the following claims.

What is claimed is:

1. A closed loop class D amplifier comprising:

an integrator having a plurality of inputs including an audio input, an audio feedback input, and a digital feedback input;

a comparator for receiving the output of the integrator and generating a series of pulses, each pulse corresponding to one of two states of the comparator and having a width proportional to the slope of the output of the integrator, and a variable frequency;

a driver circuit for receiving the pulse output of the comparator and generating gate drive signals proportional in duration to the width of the pulses;

a bridge circuit comprising two or more MOSFETs, each MOSFET having its gate coupled to one of the gate drive signals;

a low pass filter coupled to the output of the bridge for converting the bridge output into a power signal representative of the audio input signal;

means for sensing the output state of the comparator and the time that the comparator has been in said output state; and means coupled to the input of the integrator for selectively adding or removing current to the integrator in order to reduce the gain of the amplifier and maintain the switching frequency of the comparator above the frequency of the audio input.

2. A closed loop class D amplifier comprising:

an integrator having a plurality of inputs including an input at audio frequency, an audio feedback input, and a digital feedback input;

a comparator for receiving the output of the integrator and generating a series of sampling pulses, each sampling pulse having a width proportional to the output of the integrator slope and the frequency of the pulses inversely proportional to the power output of the amplifier;

a driver circuit for receiving the pulse output of the comparator and generating gate drive signals proportional in duration to the width of the pulses;

a bridge circuit comprising two or more MOSFETs, each MOSFET having its gate coupled to one of the gate drive signals;

a low pass filter coupled to the output of the bridge for converting the bridge output into a power signal representative of the audio input signal;

means for sensing the output of the comparator and for reducing the gain of the amplifier in order to maintain the sampling pulses at or above a sampling frequency substantially greater than the audio input frequency.

3. The amplifier of claim 2 wherein the sampling frequency is greater than 20 kHz.

4. A closed loop class D amplifier comprising:

an integrator having a plurality of inputs including an input at audio frequency, an audio feedback input, and a digital feedback input;

a comparator for receiving the output of the integrator and generating a series of sampling pulses, each sampling pulse having a width proportional to the output of the integrator and the frequency of the pulses inversely proportional to the power output of the amplifier;

a driver circuit for receiving the pulse output of the comparator and generating gate drive signals proportional in duration to the width of the pulses;

a bridge circuit comprising two or more MOSFETs, each MOSFET having its gate coupled to one of the gate drive signals for generating an output digital signal;

a low pass filter coupled to the output of the bridge for converting the bridge output into an output audio signal representative of the audio input signal; and means coupled to the input of the integrator for reducing the gain of the amplifier and for maintaining the sampling frequency above the input audio frequency.

5. The amplifier of claim 4 wherein the means for reducing the gain and maintaining the sampling frequency comprises a regulating circuit for sensing the time the comparator is in one of two states and for changing the input current to the integrator to change the state of the comparator.

6. The amplifier of claim 4 wherein the regulating circuit comprises a timing capacitor, a current source coupled to the timing capacitor and responsive to the state of the comparator for sourcing current to and sinking current from the timing capacitor for generating an output current signal, said output current signal coupled to the integrator for altering the state of the comparator.

7. The amplifier of claim 6 wherein the time to charge and discharge the capacitor controls the minimum sampling frequency maintained by the amplifier.

8. The amplifier of claim 6 wherein the output current signal reduces the gain of the amplifier.

9. A method for compensating switching frequency and compressing gain in a class D amplifier comprising the steps of:

integrating an input signal of an audio frequency, an audio feedback signal, and a digital feedback signal to generate a sampling frequency that varies inversely in frequency with output power;

comparing the integrated signals to a reference signal at the sampling frequency to generate a series of width modulated pulses representative of two output states of the comparator;

converting the width modulated pulses into an audio signal;

timing the duration of the comparator in each of its two states;

sensing the output of the comparator and for reducing the gain of the amplifier in order to maintain the sampling pulses at or above a sampling frequency substantially greater than the audio input frequency.

10. The method of claim 9 wherein the gain of the amplifier is reduced to maintain the sampling frequency at a frequency greater than the audio input signal frequency.

11. A method for compensating switching frequency and compressing gain in a class D amplifier comprising the steps of:

integrating an input signal of an audio frequency, an audio feedback signal, and a digital feedback signal to generate a sampling frequency that varies inversely in frequency with output power;

comparing the integrated signals to a reference signal at the sampling frequency to generate a series of width modulated pulses representative of two output states of the comparator;

converting the width modulated pulses into an audio signal;

timing the duration of the comparator in each of its two states;

sensing the output of the comparator and reducing the gain of the amplifier in order to maintain the sampling pulses at or above a sampling frequency substantially greater than the audio input frequency.

12. The method of claim 11 wherein the sampling frequency is greater than 20 kHz.

* * * * *